United States Patent
Chang et al.

(10) Patent No.: US 8,779,414 B2
(45) Date of Patent: Jul. 15, 2014

(54) COLLAPSABLE GATE FOR DEPOSITED NANOSTRUCTURES

(71) Applicant: International Business Machines Corporation, Armonk, NY (US)

(72) Inventors: Josephine B. Chang, Mahopac, NY (US); Paul Chang, Mahopac, NY (US); Michael A. Guillorn, Yorktown Heights, NY (US); Philip S. Waggoner, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/923,781

(22) Filed: Jun. 21, 2013

(65) Prior Publication Data

US 2013/0288434 A1    Oct. 31, 2013

Related U.S. Application Data

(62) Division of application No. 13/169,542, filed on Jun. 27, 2011, now Pat. No. 8,492,748.

(51) Int. Cl.
| | |
|---|---|
| *H01L 29/06* | (2006.01) |
| *H01L 31/00* | (2006.01) |
| *H01L 29/15* | (2006.01) |
| *H01L 21/00* | (2006.01) |

(52) U.S. Cl.
USPC ............ 257/29; 257/20; 257/24; 257/77; 438/151

(58) Field of Classification Search
CPC ............ H01L 29/66; H01L 29/66045; H01L 29/7606; H01L 27/00; H01L 31/101; B82Y 10/00
USPC .................... 257/29, 20, 24, 77; 438/151
See application file for complete search history.

(56) References Cited

U.S. PATENT DOCUMENTS

| 6,891,227 B2 | 5/2005 | Appenzeller et al. |
| 7,101,761 B2 | 9/2006 | Chau et al. |
| 7,453,193 B2 | 11/2008 | Den et al. |

(Continued)

OTHER PUBLICATIONS

Lee, B. et al., "Conformal Al2O3 Dielectric Layer Deposited by Atomic Layer Deposition for Graphene-based Nanoelectronics" Applicaed Physics Letters (May 19, 2008) pp. 203102-1-203102-3, vol. 92.

(Continued)

*Primary Examiner* — Long K Tran
*Assistant Examiner* — Dzung Tran
(74) *Attorney, Agent, or Firm* — Scully, Scott, Murphy & Presser, P.C.; Louis J. Percello, Esq.

(57) ABSTRACT

A disposable material layer is first deposited on a graphene layer or a carbon nanotube (CNT). The disposable material layer includes a material that is less inert than graphene or CNT so that a contiguous dielectric material layer can be deposited at a target dielectric thickness without pinholes therein. A gate stack is formed by patterning the contiguous dielectric material layer and a gate conductor layer deposited thereupon. The disposable material layer shields and protects the graphene layer or the CNT during formation of the gate stack. The disposable material layer is then removed by a selective etch, releasing a free-standing gate structure. The free-standing gate structure is collapsed onto the graphene layer or the CNT below at the end of the selective etch so that the bottom surface of the contiguous dielectric material layer contacts an upper surface of the graphene layer or the CNT.

20 Claims, 8 Drawing Sheets

(56) References Cited

U.S. PATENT DOCUMENTS

| | | |
|---|---|---|
| 7,531,437 B2 | 5/2009 | Brask et al. |
| 7,619,257 B2 | 11/2009 | Pfeiffer et al. |
| 7,619,291 B2 | 11/2009 | Jaiprakash et al. |
| 7,732,589 B2 | 6/2010 | Kim et al. |
| 2003/0170930 A1 | 9/2003 | Choi et al. |
| 2003/0178617 A1 | 9/2003 | Appenzeller et al. |
| 2006/0183278 A1 | 8/2006 | Bertin et al. |
| 2007/0064478 A1 | 3/2007 | Zhang et al. |
| 2009/0020764 A1 | 1/2009 | Anderson et al. |
| 2009/0179193 A1 | 7/2009 | Appenzeller et al. |
| 2010/0051960 A1 | 3/2010 | Chen et al. |
| 2010/0055388 A1 | 3/2010 | Chen et al. |
| 2011/0309332 A1 | 12/2011 | Chang et al. |

OTHER PUBLICATIONS

Schwierz, F., "Graphene Transistors" Nature Nanotechnology (Jul. 2010) pp. 487-496, vol. 5.

Xuan, Y. et al., "Atomic-layer-deposited Nanostructures for Graphene-based Nanoelectronics" Applied Physics Letters (Jan. 7, 2008) pp. 013101-1-013101-3, vol. 92.

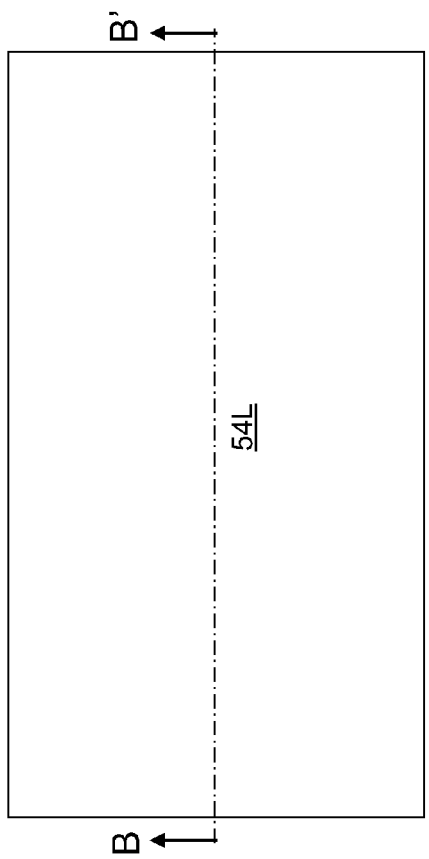
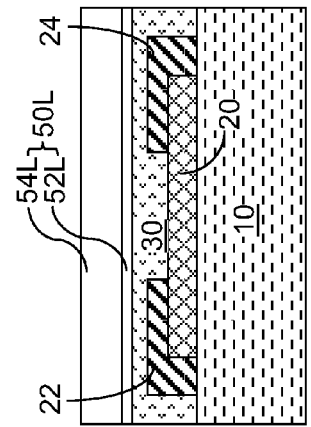
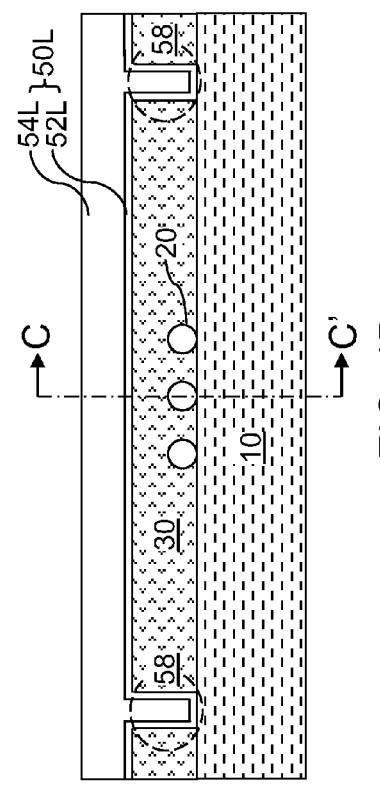
FIG. 4A
FIG. 4B
FIG. 4C

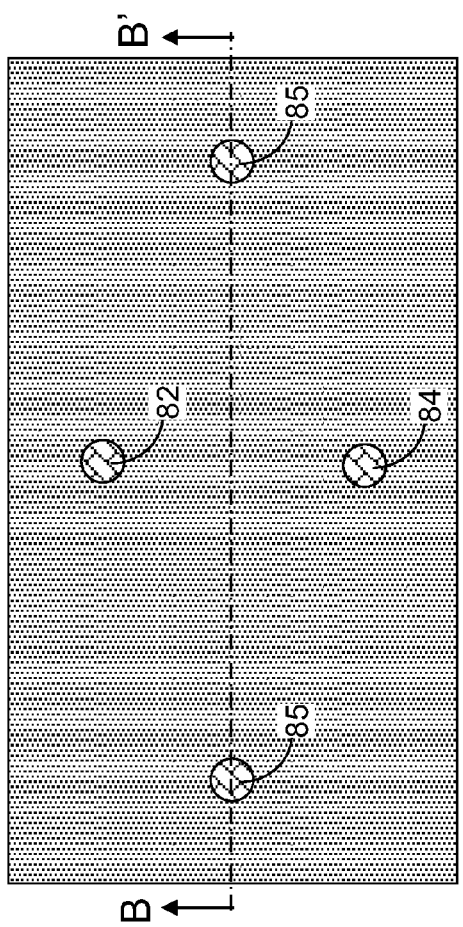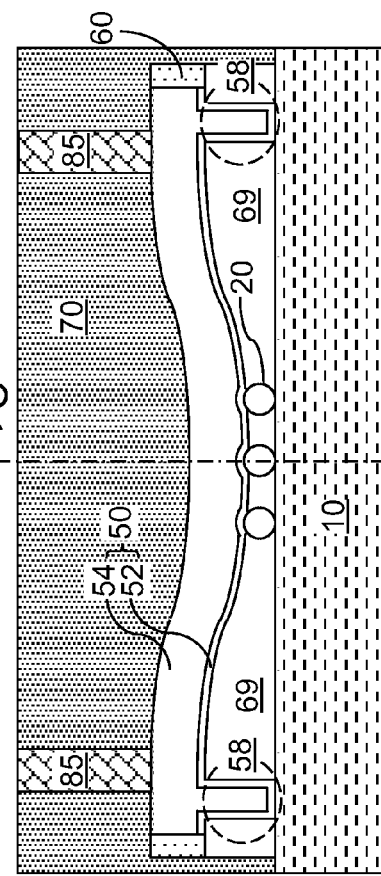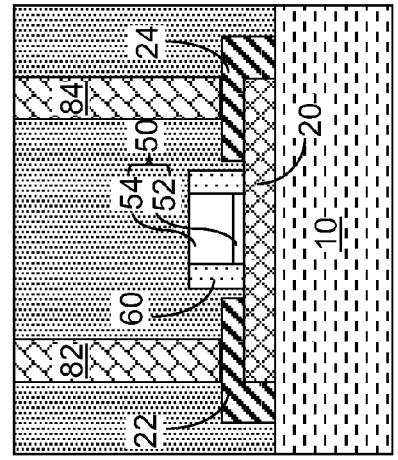
FIG. 7A
FIG. 7B
FIG. 7C

COLLAPSABLE GATE FOR DEPOSITED NANOSTRUCTURES

CROSS REFERENCE TO RELATED APPLICATION

This application is a divisional of U.S. patent application Ser. No. 13/169,542, filed Jun. 27, 2011 the entire content and disclosure of which is incorporated herein by reference.

BACKGROUND

The present disclosure generally relates to devices including at least one 2-dimensional carbon lattice structure, and particularly to field effect transistors including at least one 2-dimensional carbon lattice structure, and methods of manufacturing the same.

The ability to deposit a thin, pinhole-free gate dielectric on carbon nanostructures such as graphene and carbon nanotubes (CNTs) is important to enable the fabrication of field effect transistors with good electrostatics. However, the relative inertness of the channel material (lack of dangling bonds or chemically active sites) means that most gate dielectric materials and deposition techniques do not wet the surface of the nanostructure well.

In a first approach, a sufficient amount of dielectric material may be deposited until a surface of a graphene layer or a CNT is coated with a contiguous layer of the dielectric material. This approach results in overly thick gate dielectric films, however, because the nucleation on the graphene layer or the CNT proceeds in an island growth mode. In this approach, a continuous film is formed only after a thick enough material is deposited at a thickness greater than an optimal thickness range for the dielectric material as a gate dielectric.

In a second approach, the surface of a graphene layer or a CNT may be functionalized to make it more chemically active. Similarly, the surface of the graphene layer or the CNT may be slightly damaged through physical bombardment or plasma processes to create dangling bonds. Both of these surface treatments tend to enhance the effectiveness of an atomic layer deposition (ALD) process or a chemical vapor deposition (CVD) process to be employed to deposit a dielectric material thereupon. However, this functionalization process reduces the quality of the channel material, reducing charge mobility and overall performance of the resulting FET.

In a third approach, deposition processes may be used in which the deposited species has very low energy, and thus cannot move around. For example, spin-on gate dielectrics may be used for this purpose. However, very thin films less than 10 nm in thickness are difficult to obtain with spin-on materials, and spin-on gate dielectrics tend to be of relatively low quality and contain a lot of trapped charges and impurities, resulting in devices with large hysteresis, poor sub-threshold slope and poor repeatability.

In addition, graphene layers and carbon nanotubes are vulnerable to degradation from exposure to energetic oxygen species or plasma processes. Unfortunately, a large number of semiconductor processes, including plasma enhanced chemical vapor deposition (PECVD), reactive ion etching (RIE), and deposition of oxides by chemical vapor deposition (CVD) or physical vapor deposition (PVD), involve either energetic oxygen species or plasma processes. This greatly limits the number of microfabrication techniques that can be leveraged for the fabrication of graphene-based devices and CNT-based devices.

SUMMARY

A disposable material layer is first deposited on a graphene layer or a carbon nanotube (CNT). The disposable material layer includes a material that is less inert than graphene or CNT so that a contiguous dielectric material layer can be deposited at a target dielectric thickness without pinholes therein. For example, the disposable material layer can include a photoresist, a polymer, or a spin-on glass. The contiguous dielectric material layer and one or more gate conductor layers deposited thereupon collectively form a gate stack layer. A gate stack is formed by patterning the gate stack layer. The disposable material layer shields and protects the graphene layer or the CNT during the deposition and patterning of the gate stack layer. The disposable material layer is then removed by a selective etch, releasing a free-standing gate structure. The free-standing gate structure is collapsed onto the graphene layer or the CNT below at the end of the selective etch so that the bottom surface of the contiguous dielectric material layer contacts an upper surface of the graphene layer or the CNT.

According to an aspect of the present disclosure, a structure is provided that includes: at least one 2-dimensional carbon lattice structure located on a top surface of an insulator layer; and a gate stack including a gate dielectric and a gate conductor, wherein the gate dielectric is a structure of unitary construction and includes a first portion that contacts a top surface of the at least one 2-dimensional carbon lattice structure and a second portion vertically spaced from the top surface of the insulator layer by a distance greater than a maximum thickness of the at least one 2-dimensional carbon lattice structure.

According to another aspect of the present disclosure, a method of forming a structure is provided. The method includes: placing at least one 2-dimensional carbon lattice structure on a top surface of an insulator layer; forming a disposable material layer over at least one 2-dimensional carbon lattice structure; forming a gate stack including a gate dielectric and a gate conductor over the disposable material layer; and removing the disposable material layer selective to the gate stack and the at least one 2-dimensional carbon lattice structure, wherein a portion of the gate stack is deformed above the at least one 2-dimensional carbon lattice structure to contact a top surface of the at least one 2-dimensional carbon lattice structure.

BRIEF DESCRIPTION OF THE SEVERAL VIEWS OF THE DRAWINGS

FIG. 4A is a top-down view of the first exemplary structure according to the first embodiment of the present disclosure after formation of gate structure layers.

FIG. 4B is a vertical cross-sectional view of the first exemplary structure of FIG. 4A along a vertical plane B-B' in FIG. 4A.

FIG. 4C is a vertical cross-sectional view of the first exemplary structure of FIGS. 4A and 4B along a vertical plane C-C' in FIG. 4B.

FIG. 7A is a top-down view of the first exemplary structure according to the first embodiment of the present disclosure after formation of a dielectric material layer.

FIG. 7B is a vertical cross-sectional view of the first exemplary structure of FIG. 7A along a vertical plane B-B' in FIG. 7A.

FIG. 7C is a vertical cross-sectional view of the first exemplary structure of FIGS. 7A and 7B along a vertical plane C-C' in FIG. 7B.

DETAILED DESCRIPTION

Figure 1C:
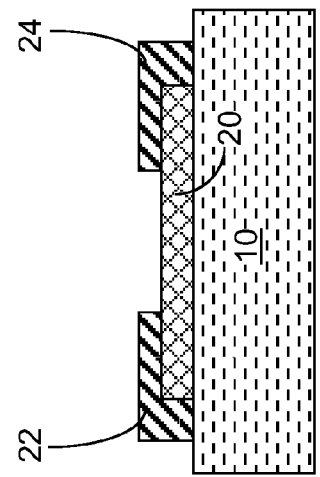
FIG. 1C is a vertical cross-sectional view of the first exemplary structure of FIGS. 1A and 1B along a vertical plane C-C' in FIG. 1B.

As stated above, the present disclosure relates to devices including at least one 2-dimensional carbon lattice structure, and particularly to field effect transistors including at least one 2-dimensional carbon lattice structure, and methods of manufacturing the same, which are now described in detail with accompanying figures. Like and corresponding elements mentioned herein and illustrated in the drawings are referred to by like reference numerals. The drawings are not necessarily drawn to scale.

Figure 1A:
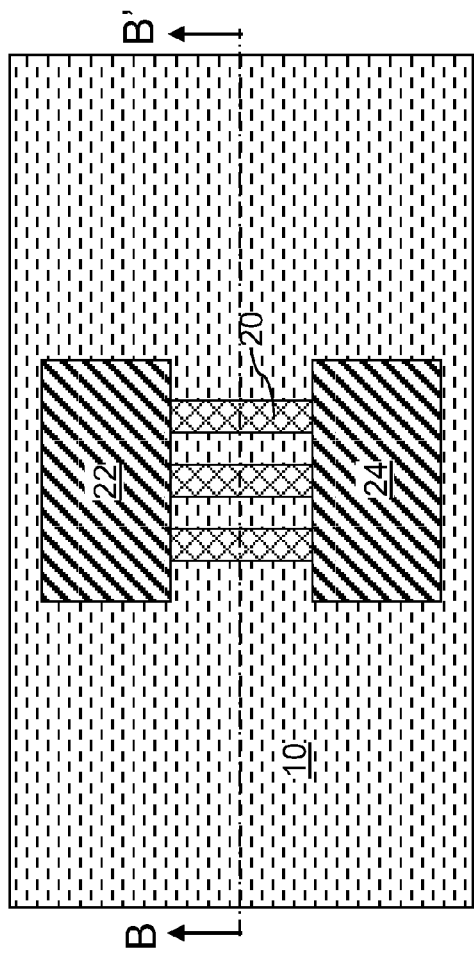
FIG. 1A is a top-down view of a first exemplary structure according to a first embodiment of the present disclosure after placement of at least one 2-dimensional carbon lattice structure, viz., carbon nanotubes, on an insulator layer and formation of a source-side metal plate and a drain-side metal plate.
Figure 1B:
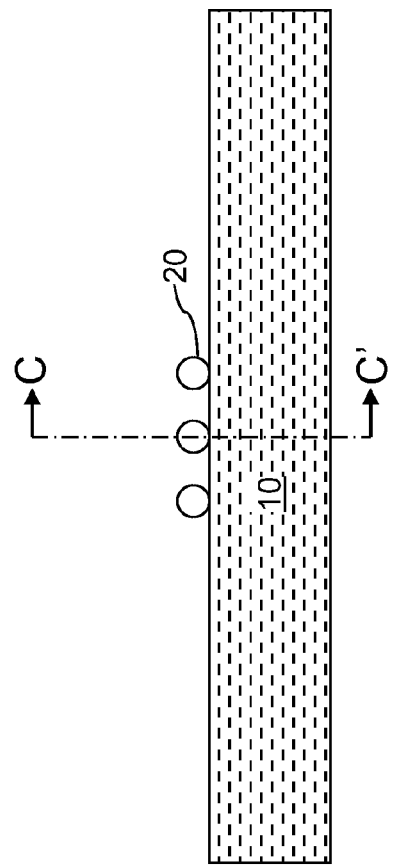
FIG. 1B is a vertical cross-sectional view of the first exemplary structure of FIG. 1A along a vertical plane B-B' in FIG. 1A.

Referring to FIGS. 1A-1C, a first exemplary structure according to a first embodiment of the present disclosure includes an insulator layer 10, which can be a substrate that stands alone or can be an upper portion of a substrate including another substrate portion (not shown) located underneath the insulator layer 10. The insulator layer 10 can be, for example, a silicon oxide layer, a silicon nitride layer, an aluminum oxide layer, or any other dielectric material layer.

At least one 2-dimensional carbon lattice structure is placed on the top surface of the insulator layer 10. As used herein, a "2-dimensional carbon lattice structure" refers to any structure that includes a 2-dimensional carbon lattice. Exemplary 2-dimensional carbon lattice structures include carbon nanotubes and graphene layers. Methods of forming 2-dimensional carbon lattice structures as known in the art may be employed to provide the at least one 2-dimensional carbon lattice structure. For example, the at least one 2-dimensional carbon lattice structure can be at least one carbon nanotube 20, i.e., or more carbon nanotubes. Each of the at least one carbon nanotube 20 can be a single wall carbon nanotube or a multi-wall carbon nanotube. Each of the at least one carbon nanotube 20 is placed on the top surface of the insulator layer 10 such that a sidewall of each carbon nanotube 20 contacts the top surface of the insulator layer 10. The diameter of each carbon nanotube 20 can be from 2 nm to 40 nm, although lesser and greater diameters can also be employed. In one embodiment, a plurality of carbon nanotubes 20 can be placed on the top surface of the insulator layer 10 such that the carbon nanotubes 20 are parallel to one another.

A source-side metal plate 22 and a drain-side metal plate 24 are formed on the 2-dimensional carbon lattice structure. The source-side metal plate 22 can be formed on one side of the at least one 2-dimensional carbon lattice structure, and the drain-side metal plate 24 can be formed on another side of the at least one 2-dimensional carbon lattice structure. For example, the source-side metal plate 22 can be formed on one side of the at least one carbon nanotube 20, and the drain-side metal plate 24 can be formed on another side of the at least one carbon nanotube 20. The thickness of the source-side metal plate 22 and the drain-side metal plate 24, as measured in a planar portion of the source-side metal plate 22 and the drain-side metal plate 24 directly above the top surface of the insulator layer 10, can be from 1 nm to 80 nm, although lesser and greater thicknesses can also be employed.

The source-side metal plate 22 and the drain-side metal plate 24 can be formed by deposition of a metal layer and lithographic patterning. The metal layer can be deposited, for example, by physical vapor deposition (PVD), vacuum evaporation, chemical vapor deposition (CVD), or any other deposition technique known in the art. The lithographic patterning can be performed, for example, by application of a photoresist (not shown) over the metal layer, lithographic exposure and development of the photoresist, removal of physically exposed portions of the metal layer, and subsequent removal of the photoresist.

Alternatively, the source-side metal plate 22 and the drain-side metal plate 24 can be formed as patterned structure by placing a mask (not shown) over the insulator layer 10 and the at least one carbon nanotube 20. The mask has openings having shapes of the source-side metal plate 22 and the drain-side metal plate 24. A beam of metallic material from an evaporation source or a sputter source is blocked by the mask except where openings are present in the mask. The beam of metallic material that is not shielded by the mask is deposited on two disjoined areas separated by (a) center portion(s) of the at least one carbon nanotube 20 to form the source-side metal plate 22 and the drain-side metal plate 24. Metallic material formed on top of the mask is then lifted off from the substrate including the insulator layer 10 by selective etching of the mask material.

In one embodiment, formation of a source-side metal plate 22 and a drain-side metal plate 24 is not performed at this processing step, but is postponed until after removal of a disposable material layer at a subsequent processing step in order to enable a controlled alignment to the gate stack.

Figure 2C:
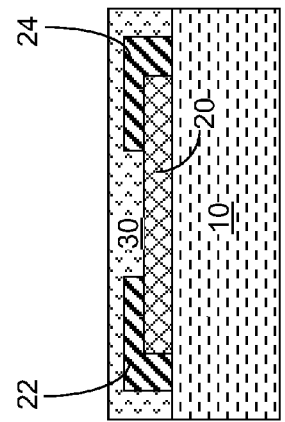
FIG. 2C is a vertical cross-sectional view of the first exemplary structure of FIGS. 2A and 2B along a vertical plane C-C' in FIG. 2B.
Figure 2A:
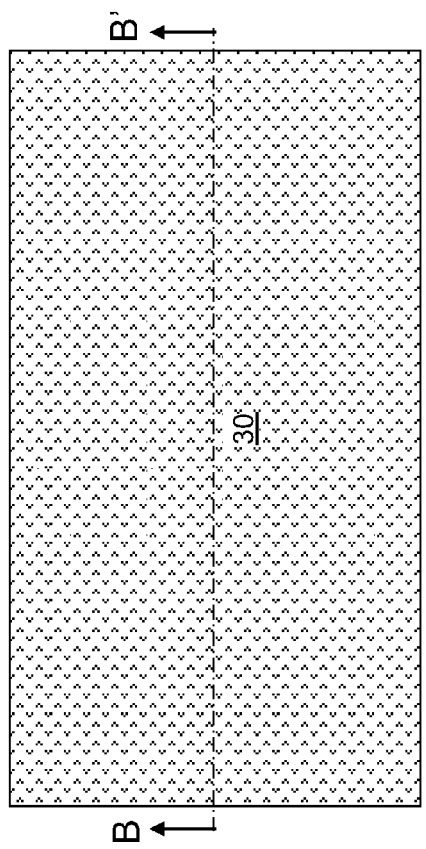
FIG. 2A is a top-down view of the first exemplary structure according to the first embodiment of the present disclosure after formation of a disposable material layer.
Figure 2B:
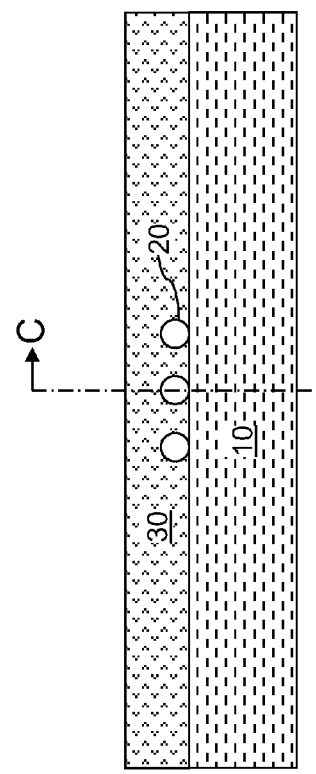
FIG. 2B is a vertical cross-sectional view of the first exemplary structure of FIG. 2A along a vertical plane B-B' in FIG. 2A.

Referring to FIGS. 2A-2C, a disposable material layer 30 is formed over the at least one carbon nanotube 20 and the source-side metal plate 22 (if present) and the drain-side metal plate 24 (if present). The disposable material layer 30 includes a material on which a gate dielectric material, such as silicon oxide or a high dielectric constant (high-k) material known in the art can nucleate conformally without forming isolated islands. Such uniform nucleation of the dielectric material can be achieved if the material of the disposable material layer is less inert than the at least one 2-dimensional carbon lattice structure, i.e., the carbon atoms on the surface of the at least one carbon nanotube 20 that do not have dangling bonds.

For example, the disposable material layer 30 can include a self-planarizing material that can be deposited by spin coating. Such self-planarizing materials include, but are not limited to, a photoresist, a polymer, and a spin-coatable oxide material, which is also referred to as spin-on oxide (SOG). If the disposable material layer 30 includes a self-planarizing material, the entirety of the top surface of the disposable material layer 30 can be planar, and is parallel to the top surface of the insulator layer 10. The disposable material layer 30 includes a material that is different from the material of a gate dielectric to be subsequently formed so that the disposable material layer 30 can be removed selective to the gate dielectric 52.

The thickness of the disposable material layer 30, as measured from the highest surface (i.e., a surface with a most distance from the top surface of the insulator layer 10) among the at least one carbon nanotube 20, the source-side metal plate 22 (if present), and the drain-side metal plate 24 (if present), can be from 1 nm to 60 nm, and typically from 3 nm to 20 nm, although lesser and greater thicknesses can also be employed.

Figure 3A:
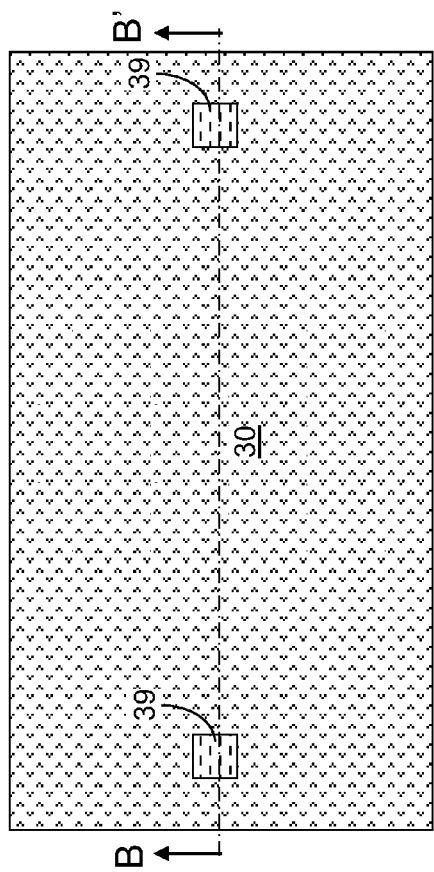
FIG. 3A is a top-down view of the first exemplary structure according to the first embodiment of the present disclosure after formation of holes in the disposable material layer.
Figure 3B:
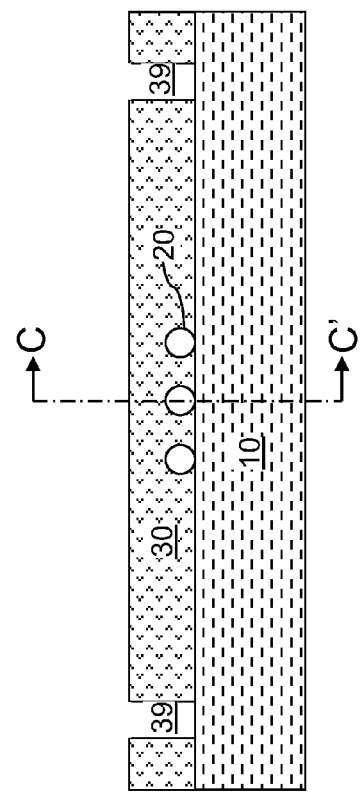
FIG. 3B is a vertical cross-sectional view of the first exemplary structure of FIG. 3A along a vertical plane B-B' in FIG. 3A.
Figure 3C:
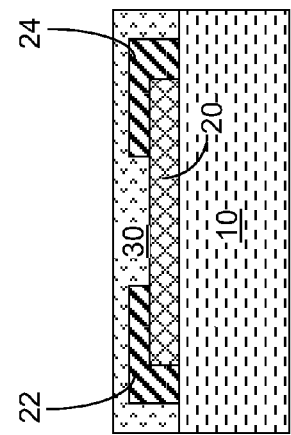
FIG. 3C is a vertical cross-sectional view of the first exemplary structure of FIGS. 3A and 3B along a vertical plane C-C' in FIG. 3B.

Referring to FIGS. 3A-3C, at least one hole 39 is formed in the disposable material layer 30. If the disposable material layer 30 includes a photoresist, the at least one hole 39 can be formed by lithographically exposing a region of the photoresist and developing the exposed regions of the photoresist so that each removed portion of the photoresist constitutes a hole within the photoresist, i.e., the disposable material layer 30. If the disposable material layer 30 is not photosensitive, a photoresist layer (not shown) can be deposited on the disposable material layer 30 and lithographically patterned to form at least one hole therein. The pattern of the at least one hole in the photoresist layer is transferred into the disposable material layer 30, for example, by an etch that employs the photoresist layer as an etch mask. The photoresist layer is subsequently removed selective to the disposable material layer 30, for example, by ashing. The disposable material layer 30 includes at least one hole 39 therein.

The at least one hole 39 in the disposable material layer 30 extends from the top surface of the disposable material layer 30 to the bottommost surface of the disposable material layer 30. Thus, the top surface of the insulator layer 10 is exposed at the bottom of each of the at least one hole 39 within the disposable material layer 30. In one embodiment, the at least one hole 39 can be a plurality of holes 39 that is located on both sides of the at least one carbon nanotube 20. For example, the plurality of holes can be along a horizontal direction that is perpendicular to the lengthwise direction of the at least one carbon nanotube 20. For example, the horizontal direction along which the plurality of holes is located is the horizontal direction within the B-B' plane in FIGS. 3A-3C, and the lengthwise direction of the at least one carbon nanotube 20 is the horizontal direction of the C-C' plane in FIGS. 3A-3C.

Referring to FIGS. 4A-4C, gate structure layers 50L are deposited over the disposable material layer 30. The gate structure layers 50L include a vertical stack of a gate dielectric layer 52L and a gate conductor layer 54L.

In one embodiment, the gate dielectric layer 52L includes a dielectric material such as silicon oxide, silicon oxynitride, silicon nitride, or a combination thereof. Such dielectric materials have a dielectric constant that does not exceed 8.0, and can be deposited, for example, by chemical vapor deposition (CVD). The thickness of the gate dielectric layer 52L in this embodiment can be from 1 nm to 6 nm, although lesser and greater thicknesses can also be employed.

In another embodiment, the gate dielectric layer 52L can be a high dielectric constant (high-k) material layer having a dielectric constant greater than 8.0. For example, the gate dielectric layer 52L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 52L, as measured at horizontal portions, can be from 0.9 nm to 6 nm, and preferably from 1.0 nm to 3 nm. The gate dielectric layer 52L may have an effective oxide thickness on the order of or less than 1 nm.

In yet another embodiment, the gate dielectric layer 52L can be a stack of at least one dielectric material having a dielectric constant that does not exceed 8.0 and at least another dielectric material having a dielectric constant that is greater than 8.0, i.e., a high-k dielectric material. The total thickness of the gate dielectric layer 52L in this embodiment can be from 1 nm to 6 nm, although lesser and greater thicknesses can also be employed.

The gate conductor layer 54L includes a conductive material, which can include at least one doped semiconductor material, at least one metallic material, or a combination thereof. Doped semiconductor materials that can be employed for the gate conductor layer 54L include doped silicon, doped germanium, doped silicon-germanium alloys, and doped compound semiconductor materials. Metallic materials that can be employed for the gate conductor layer 54L include transition metals and conductive oxides and/or nitride of at least one transition metal, Lanthanides, and/or Actinides. The thickness of the gate conductor layer 54L, as measured from above a planar top surface of the disposable material layer 30, can be from 30 nm to 600 nm, although lesser and greater thicknesses can also be employed.

Each of the holes 39 in the disposable material layer 30 is filled with the gate structure layers 50L to form a pillar portion 58 therein. Each pillar portion 58 includes a portion of the gate dielectric layer 52L and a portion of the gate conductor layer 54L. The portion of the gate conductor layer 54L within each pillar portion 58 is laterally surrounded by a portion of the gate dielectric layer 52L, and is vertically spaced from the top surface of the insulator layer 10 by the portion of the gate dielectric layer 52L. The height of each pillar portion 58 is the same as the thickness of the disposable material layer 20 as measured from the top surface of the insulator layer 10.

Figure 5A:
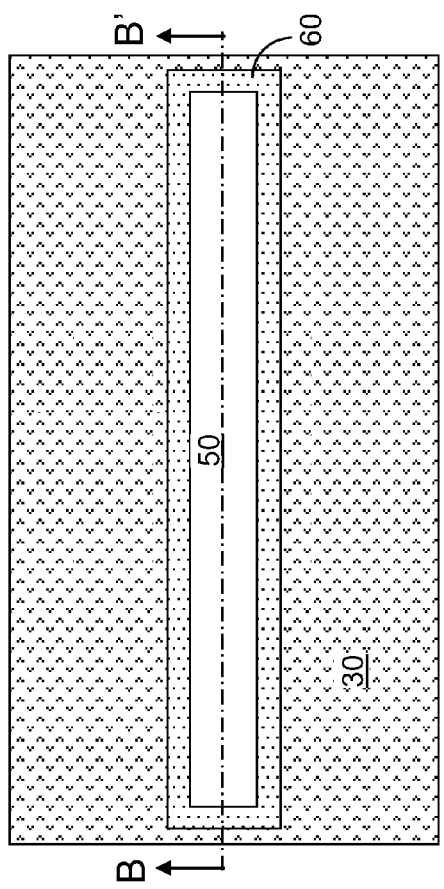
FIG. 5A is a top-down view of the first exemplary structure according to the first embodiment of the present disclosure after patterning of gate stack layers and optional formation a dielectric spacer.
Figure 5C:
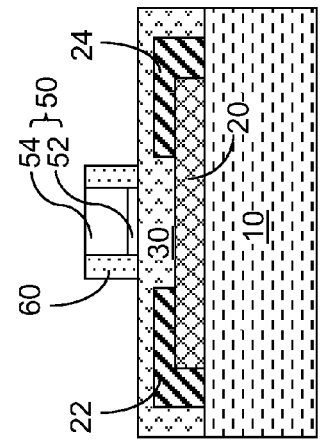
FIG. 5C is a vertical cross-sectional view of the first exemplary structure of FIGS. 5A and 5B along a vertical plane C-C' in FIG. 5B.
Figure 5B:
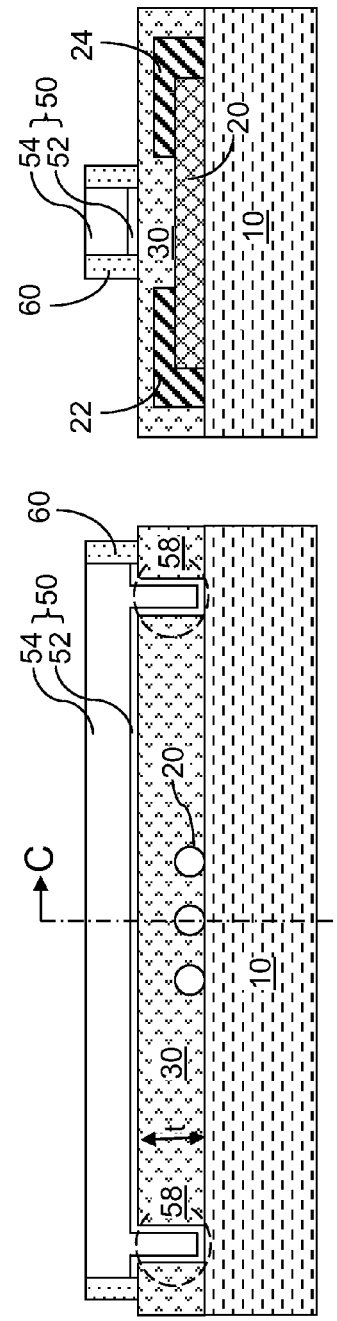
FIG. 5B is a vertical cross-sectional view of the first exemplary structure of FIG. 5A along a vertical plane B-B' in FIG. 5A.

Referring to FIGS. 5A-5C, the portion of the gate structure layers 50L above the disposable material layer 30 is lithographically patterned. For example, a photoresist (not shown) can be applied on the gate structure layers 50L and patterned by lithographic exposure and development. The pattern in the photoresist is subsequently transferred into the portion of the gate structure layers 50L located above the disposable material layer 30 by an etch that employs the photoresist as an etch mask. The remaining portion of the gate structure layers 50L constitute a gate structure 50, which includes a vertical stack of a gate dielectric 52 and a gate conductor 54. The gate dielectric 52 is the remaining portion of the gate dielectric layer 52L, and the gate conductor 54 is the remaining portion of the gate conductor layer 54L.

The gate stack 50 includes an upper portion and at least one pillar portion 58. The upper portion is the portion of the gate stack 50 that is located above the top surface of the disposable material layer 30. Each of the at least one pillar portion 58 is a portion of the gate stack 50 that is located below the top surface of the disposable material layer 30. The top surface of the disposable material layer 30 is within a horizontal plane, and the entirety of the top surface of the disposable material layer 30 is planar. The entirety of the upper portion is spaced from the top surface of the insulator layer 10 by the thickness t of disposable material layer 30.

The entirety of the gate dielectric 52 is contiguous, i.e., for any pair of points within the gate dielectric 52, there exists a continuous path that is contained entirely within the gate dielectric 52 and connects the pair of points. Likewise, the entirety of the gate conductor 54 is contiguous. Each of the at least one pillar portion 58 fills a hole within the disposable material layer 30. Each of the at least one pillar portion 58 has a bottom surface that contacts the top surface of the insulator layer 10.

Optionally, a dielectric spacer 60 can be formed on the sidewalls of the gate stack 50. The dielectric spacer 60 can be formed, for example, by deposition of a conformal dielectric material layer and an anisotropic etch such as a reactive ion etch (RIE). At this point, the at least one carbon nanotube 20 is protected by the disposable material layer 30, allowing the use of deposition and RIE processes that would otherwise damage the at least one carbon nanotube 20. This is especially significant as the anisotropy required for spacer RIE tends to require processes that include more physical bombardment than isotropic etches, and thus are more likely to damage the 2-dimensional carbon lattice. The remaining vertical portion of the conformal dielectric material layer is the dielectric spacer 60. The dielectric spacer 60 can be employed to provide or enhance the electrical isolation between the gate conductor 54 and the source-side metal plate 22 and the electrical isolation between the gate conductor 54 and the drain-side metal plate 24.

Figure 6A:
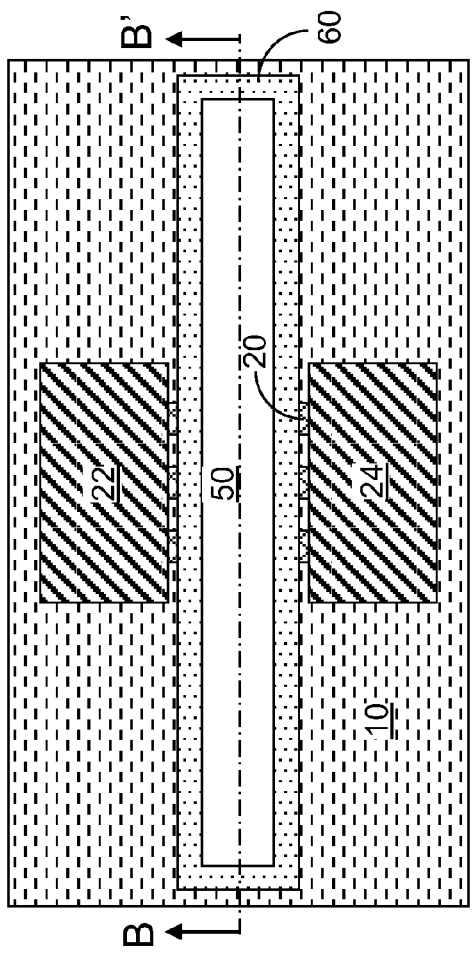
FIG. 6A is a top-down view of the first exemplary structure according to the first embodiment of the present disclosure after selective removal of the disposable material layer.
Figure 6B:
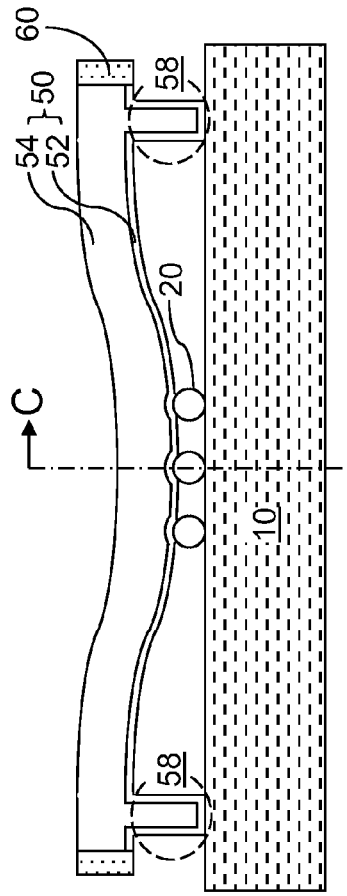
FIG. 6B is a vertical cross-sectional view of the first exemplary structure of FIG. 6A along a vertical plane B-B' in FIG. 6A.
Figure 6C:
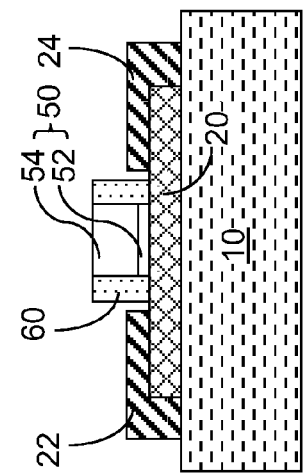
FIG. 6C is a vertical cross-sectional view of the first exemplary structure of FIGS. 6A and 6B along a vertical plane C-C' in FIG. 6B.

Referring to FIGS. 6A-6C, the disposable material layer 30 is removed in an etch process that is selective to the gate stack 50 and the at least one 2-dimensional carbon lattice structure, i.e., the at least one carbon nanotube 20. Preferably, the etch process is also selective to the material of the insulator layer 10 and the dielectric spacer 60, if present. For example, the disposable material layer 30 can be removed by a wet etch that selectively removes the material of the disposable material layer 30, while not etching the gate dielectric 52. If the disposable material layer 30 includes a photoresist or a polymer, acetone or a piranha solution (i.e., a mixture of sulfuric acid ($H_2SO_4$) and hydrogen peroxide ($H_2O_2$)). If the disposable material layer 30 includes a spin-coatable oxide material, and a bottom surface of the gate dielectric 52 includes a high-k dielectric material, silicon nitride, or silicon oxynitride, hydrofluoric acid (HF) can be employed as the etchant.

As the disposable material layer 30 is removed selective to the gate stack 50 and the at least one 2-dimensional carbon lattice structure, a center portion of the upper portion of the gate stack 50 located between the at least one pillar portion 58 is deformed above the at least one 2-dimensional carbon lattice structure to contact a top surface of the at least one 2-dimensional carbon lattice structure. For example, a center portion of the upper portion of the gate stack 50 located between the pair of pillar portions 58 in FIGS. 6A-6C is deformed above the at least one carbon nanotubes 20 to contact the top surfaces of each of the at least one carbon nanotube 20.

The mechanism for the deformation of the center portion of the upper portion of the gate stack 50 can include surface tension of the etchant solution during the end of the wet etch and/or gravity. In case surface tension is the main mechanism for the deformation, an order of magnitude estimation of the critical pull-in length can be provided by assuming that the upper portion of the gate stack 50 can be approximated as an unstressed beam. For an unstressed beam, the critical "pull-in" length at or above which beams will come in contact with an underlying substrate due to the surface tension of water, which approximates the surface tension of various aqueous etchants, is provided by the following formula:

$$L_{PI} = \sqrt[4]{\frac{32 E_{gate} h_{gap}^2 t_{gate}^3}{\gamma_{H_2O}}},$$

wherein $L_{PI}$ is the pull-in length to be determined, $E_{gate}$ is Young's modulus of the material of the gate stack 50, $t_{gate}$ is the thickness of the gate stack 50, and $h_{gap}$ is the height of the gap between the bottom surface of the gate stack 50 prior to deformation and the topmost surface of the underlying structure, i.e., the topmost surface of the at least one carbon nanotube 20, and $\gamma_{H_2O}$ is the surface tension of water. Assuming that $E_{gate}$ is on the order of about 200 GPa, $t_{gate}$ is on the order of 40 nm, and $h_{gap}$ is on the order of 10 nm, and $\gamma_{H_2O}$ is about 70 mN/m, the pull-in length of the upper portion of the gate stack 50 is about 870 nm. Thus, if the separation between the pair of pillar portions 58 is greater than 870 nm, and if all the parameters in the equations have the values used in the calculation above, the bottom surface of the center portion of the gate stack 50 bends downward by surface tension to make a physical contact with the top surface(s) of the at least one carbon nanotube 20 before the aqueous solvent is dried at the end of the wet etch step. For a 1.5 micron long beam, i.e., for an upper portion of the gate stack 50 that has 1.5 microns between the two pairs of pillar portions 58, about half of the beam collapses onto the at least one carbon nanotube 20.

The entirety of the top surface of the gate stack 50 is a contiguous surface including horizontal portions and non-horizontal curved portions. The vertical deviation y of the top surface of the gate stack 50 from the original planar horizontal surface of the top surface of the gate stack 50 as a function of a horizontal distance x from the nearest of the two pillar portions 58 along the direction of the beam, i.e., the direction of the horizontal portion of the gate stack 50, is given by:

$$y(x) = \frac{\gamma_{H_2O} L^4}{64 E t_{gate}^3 h_{gap}} \left(1 - \cos\left(\frac{2\pi x}{L}\right)\right).$$

wherein L is the length of the beam, i.e., the lateral distance between the two pairs of pillar portions 58.

The entirety of the upper portion of the gate stack 50 is spaced from the top surface of the insulator layer 10 by at least one half of the maximum thickness of the at least one 2-dimensional carbon lattice structure, i.e., by at least the maximum radius of the at least one carbon nanotube 20, and typically, depending on the elasticity of the gate dielectric 52, typically by at least 85% of the diameter of the at least one carbon nanotube 20. Local deformation of the gate dielectric 52 around the topmost portions of the sidewalls of the at least one carbon nanotube 20 may increase the contact area between the at least one carbon nanotube 20 and the gate dielectric 52. As discussed above, each of the at least one pillar portion 58 includes a portion of the gate dielectric 52 and a portion of the gate conductor 54.

Other mechanisms can increase the deformation of the upper portion of the gate stack 50. For example, the upper portion of the gate stack 50 is not an unstressed beam in actuality, but is also subject to gravity. Thus, the actual deformation of the upper portion of the gate stack 50 can be more than the amount calculated above. Further, many gate metal materials within the gate conductor 54 can be under compressive stress. Such compressive stress would exaggerate beam buckling once surface tension perturbs the beam (the upper portion of the gate stack 50), increase contacted area between the upper portion of the gate stack 50 and the at least one carbon nanotube 20, and provide additional contact force to keep beam collapsed and in contact with the at least one carbon nanotube. Once the upper portion of the gate stack 50 collapses onto the top surfaces of the at least one carbon nanotube, the deformation of the upper portion of the gate stack 50 remains even after the aqueous solvent is completely removed because bonds are formed between the bottom surface of the upper portion of the gate stack 50 and the top surface(s) of the at least one carbon nanotube 20 that are in contact with each other.

The gate dielectric 50 is a structure of unitary construction, i.e., in a single contiguous structure in which any point therein can be contiguously connected to another point therein through a line that is contained entirely within the gate dielectric. The gate dielectric includes at least a first portion and a second portion. The first portion contacts a top surface of the at least one 2-dimensional carbon lattice structure 20. For example, the first portion can be the portion of the gate dielectric 50 that directly overlies the at least one carbon nanotube 20. The second portion is vertically spaced from the top surface of the insulator layer 10 by a distance greater than a maximum thickness of the at least one 2-dimensional carbon lattice structure 20. A plurality of second portions can be present. For example, a second portions can be located between the first portion and each of the at least one pillar portion 58.

In one embodiment, formation of the source-side metal plate 22 and the drain-side metal plate 24 is not performed at the processing step of FIGS. 1A-1C, but may be deferred until the collapse of the upper portion of the gate stack 50 onto the top surface(s) of the at least one carbon nanotube 20. The presence of the gate stack at this point enables the use of self-alignment techniques such as ion implantation or gate shadowing techniques.

Referring to FIGS. 7A-7C, a dielectric material layer 70 can be deposited over the at least one 2-dimensional carbon lattice structure (i.e., the at least one carbon nanotube 20), the gate stack 50, the source-side metal plate 22, and the drain-side metal plate 24. The dielectric material layer 70 includes a dielectric material such as silicon oxide, silicon nitride, organosilicate glass (OSG), or any other dielectric material that can be employed in metal interconnect structures. If the deposition process employed to deposit the dielectric material layer 70 is not conformal, at least one cavity 69 can be formed between the bottom surface of the gate stack 50 and the top surface of the insulator layer 10. If the deposition process employed to deposit the dielectric material layer 70 is conformal, the dielectric material may fill the volume between the bottom surface of the gate stack 50 and the top surface of the insulator layer 10 so that no cavity is formed therein.

Various contact structures can be formed within the dielectric material layer 70 to contact the device underneath the dielectric material layer 70. The device underneath the dielectric material layer 70 constitutes a field effect transistor employing the at least one 2-dimensional carbon lattice structure (i.e., the at least one carbon nanotube 20). One end of each carbon nanotube 20 functions as a source of a field effect transistor, the other end of each carbon nanotube 20 functions as a drain of the field effect transistor, and the gate dielectric 52 and the gate conductor 54 within the gate stack 50 function as a gate dielectric and a gate conductor of the field effect transistor. The various contact structures can include at least one source-side contact structure 82 contacting the source-side metal plate 22, at least one drain-side contact structure 84 contacting the drain-side metal plate 24, and at least one gate-side contact structure 85 contacting the gate conductor 54.

Figure 8A:
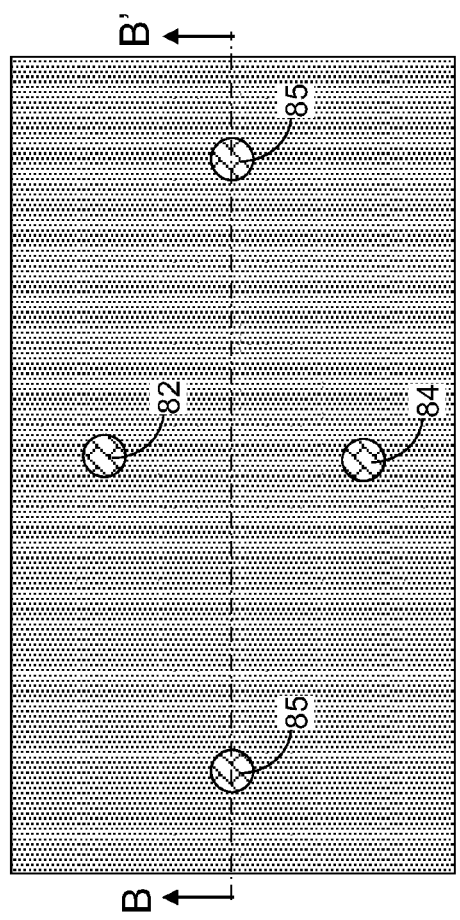
FIG. 8A is a top-down view of a second exemplary structure according to a second embodiment of the present disclosure.
Figure 8C:
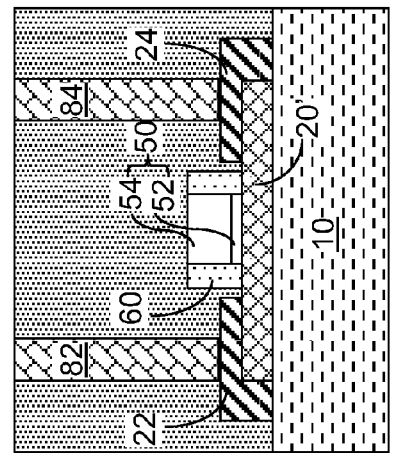
FIG. 8C is a vertical cross-sectional view of the second exemplary structure of FIGS. 8A and 8B along a vertical plane C-C' in FIG. 8B.
Figure 8B:
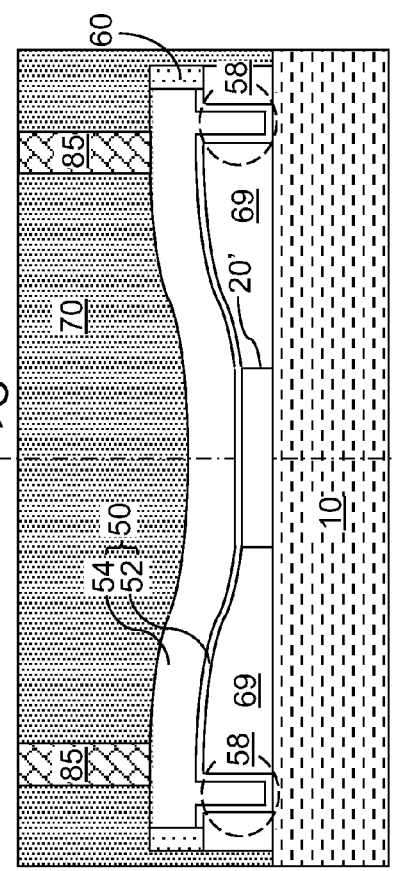
FIG. 8B is a vertical cross-sectional view of the second exemplary structure of FIG. 8A along a vertical plane B-B' in FIG. 8A.

Referring to FIGS. 8A-8C, a second exemplary structure according to a second embodiment of the present disclosure can be derived from the first exemplary structure by replacing the at least one carbon nanotube 20 with at least one graphene layer 20', i.e., at east one layer of graphene. The same processing steps can be employed as in the first embodiment. The bottom surface of the gate stack 50, i.e., the bottom surface of the gate dielectric 50 contacts the top surface of the at least one graphene layer 20'. The at least one graphene layer 20' can include a single layer of graphene, i.e., a monolayer of carbon in the form of a graphene monolayer sheet, or may include a plurality of graphene layers. The thickness of the at least one graphene layer 20' can be from the thickness of a single monolayer of graphene (which is about 0.5 nm) to 40 nm, although greater thicknesses can also be employed.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure comprising:
placing at least one 2-dimensional carbon lattice structure on a top surface of an insulator layer;
forming a disposable material layer over at least one 2-dimensional carbon lattice structure;
forming a gate stack including a gate dielectric and a gate conductor over said disposable material layer; and removing said disposable material layer selective to said gate stack and said at least one 2-dimensional carbon lattice structure, wherein a portion of said gate stack is deformed above said at least one 2-dimensional carbon lattice structure to contact a top surface of said at least one 2-dimensional carbon lattice structure.

2. The method of claim 1, wherein another portion of said gate stack is vertically spaced from said top surface of said insulator layer by a distance greater than a maximum thickness of said at least one 2-dimensional carbon lattice structure after said portion of said gate stack is deformed.

3. The method of claim 1, further comprising forming at least one hole within said disposable material layer, wherein a pillar portion of said gate stack is formed within each of said at least one hole.

4. The method of claim 3, wherein said gate stack includes an upper portion and said at least one pillar portion, wherein an entirety of said upper portion is spaced from said top surface of said insulator layer by at least one half of said maximum thickness of said at least one 2-dimensional carbon lattice structure after said selective removal of said disposable material layer.

5. The method of claim 3, wherein a portion of said top surface of said insulator layer is physically exposed in said at least one hole.

6. The method of claim 5, wherein said gate dielectric contacts said portion of said top surface of insulator layer.

7. The method of claim 3, wherein said gate dielectric is formed as a contiguous layer contacting a top surface of said disposable material layer and sidewalls of said disposable material layer within said at least one hole.

8. The method of claim 1, further comprising:
forming a source-side metal plate on one side of said at least one 2-dimensional carbon lattice structure; and
forming a drain-side metal plate on another side of said at least one 2-dimensional carbon lattice structure.

9. The method of claim 8, wherein said source-side metal plate and said drain-side metal plate are formed by:
disposing a mask over said insulator layer and said at least one carbon nanotube, said mask including openings having shapes of said source-side metal plate and said drain-side metal plate; and
depositing a metallic material from an evaporation source on physically exposed portions of said at least one 2-dimensional carbon lattice structure employing said mask as a making structure.

10. The method of claim 8, further comprising
forming a source-side contact structure contacting said source-side metal plate;
forming a drain-side contact structure contacting said drain-side metal plate; and
forming a gate-side contact structure contacting said gate conductor.

11. The method of claim 1, further comprising depositing a dielectric material layer over said at least one 2-dimensional carbon lattice structure and said gate stack after deformation of said portion of said gate stack.

12. The method of claim 11, wherein at least one cavity is formed between a bottom surface of said gate stack and said top surface of said insulator layer after deposition of said dielectric material layer.

13. The method of claim 11, further comprising forming a dielectric spacer around said gate stack prior to removal of said disposable material layer.

14. The method of claim 13, wherein at least one cavity contacts a bottom surface of said dielectric spacer after formation of said dielectric material layer.

15. The method of claim 1, wherein said disposable material layer includes a material that is less inert than said at least one 2-dimensional carbon lattice structure.

16. The method of claim 1, wherein said disposable material layer is formed by spin coating of a material selected from a photoresist, a polymer, and a spin-coatable oxide material.

17. The method of claim 1, wherein said at least one 2-dimensional carbon lattice structure includes at least one layer of graphene.

18. The method of claim 1, wherein said at least one 2-dimensional carbon lattice structure includes at least one carbon nanotube.

19. The method claim 1, wherein said disposable material layer is formed by spin coating of a self-planarizing material.

20. The method of claim 19, wherein said self-planarizing materials is selected from a photoresist, a polymer, and a spin-on oxide (SOG).

* * * * *